(12) United States Patent
Elm et al.

(10) Patent No.: US 6,384,323 B2
(45) Date of Patent: *May 7, 2002

(54) HIGH-FREQUENCY-SHIELDED SWITCHGEAR CABINET

(75) Inventors: Oskar Elm, Dietzhölztal; Walter Nicolai, Buseck; Jürgen Schnaubelt; Matthias Schüler, both of Dietzhölztal, all of (DE)

(73) Assignee: Rittal-Werk Rudolf Loh GmbH, Herborn (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/065,080

(22) PCT Filed: Oct. 22, 1996

(86) PCT No.: PCT/EP96/04577
§ 371 Date: Apr. 24, 1998
§ 102(e) Date: Apr. 24, 1998

(87) PCT Pub. No.: WO97/16950
PCT Pub. Date: May 9, 1997

(30) Foreign Application Priority Data

Oct. 28, 1995 (DE) .......................... 195 40 332

(51) Int. Cl.⁷ .................................. H05K 9/00
(52) U.S. Cl. .............. 174/35 R; 174/35 GC; 174/35 MS; 361/799; 361/800; 361/816; 361/818
(58) Field of Search .......... 174/35 R, 35 MS, 174/35 GC; 361/816, 818, 799, 800

(56) References Cited

U.S. PATENT DOCUMENTS

| 3,642,457 | A | * | 2/1972 | Brill Edwards ............. 29/196.5 |
| 4,056,366 | A | * | 11/1977 | Lee et al. ...................... 29/653 |
| 5,214,242 | A | | 5/1993 | Gallagher ..................... 174/35 |
| 5,592,927 | A | * | 1/1997 | Zaluzec et al. ............. 123/668 |
| 5,608,280 | A | * | 3/1997 | Tamemoto et al. ......... 310/239 |
| 5,755,246 | A | * | 5/1998 | Carl et al. .................... 134/73 |
| 5,828,012 | A | * | 10/1998 | Repolle et al. ............. 181/175 |
| 5,913,582 | A | * | 6/1999 | Coonan ................... 312/223.3 |

FOREIGN PATENT DOCUMENTS

| DE | 3611693 C1 | | 5/1987 |
| DE | 4008738 C1 | | 8/1990 |
| DE | 4207308 A1 | | 9/1993 |
| DE | 4207308 | * | 9/1993 |
| DE | 91 00 798 | | 1/1994 |
| EP | 0 428 335 A2 | | 11/1990 |

* cited by examiner

Primary Examiner—William A. Cuchlinski, Jr.
Assistant Examiner—Ronnie Mancho
(74) Attorney, Agent, or Firm—Jansson, Shupe & Munger, Ltd.

(57) ABSTRACT

The invention is an improvement to a high-frequency-shielded switchgear cabinet having a cabinet body which can be or is composed of wall elements and has at least one opening which can be closed by a cabinet door. Gaps formed in the cabinet body and between the cabinet body and door can be closed or sealed so as to be high-frequency-shielded by means of electrically and magnetically conductive sealing strips. In order to attain a corrosion-free switchgear cabinet which has a long service life and can be easily produced, the wall elements and cabinet door are made of aluminum-zinc-coated sheet metal and are provided at least in regions facing the gaps to be sealed without additional surface-protecting coverings. The sealing strips are directly connected to the untreated surface of the wall elements and/or cabinet door.

6 Claims, 4 Drawing Sheets

HIGH-FREQUENCY-SHIELDED SWITCHGEAR CABINET

FIELD OF THE INVENTION

The invention relates generally to a switch cabinet and, more particularly, to a high-frequency-shielded switch cabinet that utilizes electrically and magnetically conductive sealing strips that are high-frequency (HF) impervious.

BACKGROUND OF THE INVENTION

The manufacture of an HF impervious switch cabinet with a sufficiently long life span is very complicated and expensive. Among the fundamental issue of concern to the manufacturer is whether the switch cabinet features a rack onto which the wall elements and the cabinet door are attached, or whether the wall elements are themselves connected, e.g., welded into a unified cabinet body.

It is well known in the art that switch cabinets can be manufactured of stainless steel, whereby contact strips are applied in the area of the gaps, providing HF imperviousness.

It is also known that a separate, closed insert can be placed in the switch cabinet in order to achieve HF imperviousness, as is illustrated in DE 3611 693 C1. Such additional insert has its drawbacks in that it increases the cost of the switch cabinet by a considerable amount.

A method of manufacturing a sheet metal housing from a housing body having at least one opening is known from DE 91 00 798 U1, in which a switch cabinet having a door, wall element, floor plate, cover plate, flange plate or the like to serve as a closing part for the purpose of closing it, whereby the closing part around the opening of the housing body can be connected to it so as to be electrically and magnetically conductive.

Following manufacture, the body of the housing which is made with sheet metal is provided with a contact surface around the opening. This contact surface is covered by means of a covering band before it is cleaned and then painted. The covering band is finally removed. The contact surface comprised of highly conductive and corrosion resistant material is fused or welded on, for which purpose laser technology is preferably used. This procedure is not only complex, it also requires considerable installations in order to be implemented.

As DE 42 07 308 A1 illustrates, this known method is improved in that the housing body is greased prior to the attachment of the contact surfaces, and the contact surface is attached to the greased housing body around the opening by means of the flame spray method. The contact surface is then covered with the covering band, the housing body is cleaned and then painted. Finally the covering band is removed. In this way the expense for preparation is reduced and the manufacture of the switch cabinet is simplified. The corrosion resistance in the area of the contact surface, however, is insufficient, thus resulting in a decrease in life span and a weakening of the HF shielding.

OBJECTS OF THE INVENTION

An object of the invention is to provide an HF impervious switch cabinet that overcomes some of the problems and shortcomings of the prior art.

Another object of the invention is to provide an HF impervious switch cabinet which allows for ease of manufacture while maintaining minimal installation complexity, and still results in an increased life span with a decreased tendency to corrode. How these and other objects are accomplished will become apparent from the following descriptions and from the drawings.

SUMMARY OF THE INVENTION

The invention involves wall elements and the cabinet door that are finished with aluminum-zinc coated sheet metal. Such wall elements and door are not provided with any additional surface protection coating, at least not in the areas facing the slots which are to be sealed. Sealing strips are connected directly to the untreated surface of the wall elements and/or cabinet door.

The use of aluminum-zinc coated sheet metal offers the advantage that expensive stainless steel and corrosion susceptible chromed steel sheet can be avoided. The aluminum zinc coated surfaces of the cabinet body can be used without any additional surface protection coating. If an aesthetic adaptation to other switch cabinets is required, then the application of a surface protection coating can remain limited to the outside. The electrically and magnetically conductive sealing strips for HF sealing of the gaps can be directly connected to the untreated inside of the cabinet body.

The improvement in corrosion protection as compared to steel depends on the formation of a solid and adhesive covering layer on the initially used material and on the cathodic protective action of the zinc portion. The abrasion values with respect to bright steel sheet are reduced to fractions, resulting in the advantage of a manifold increase in the life span of the new switch cabinet precisely in the area of the contact points that provide the HF imperviousness.

One embodiment of the new switch cabinet is characterized by the fact that it features a rack finished solely with aluminum-zinc sheet metal (i.e., the rack is not protected with any additional surface protection coating). Wall elements and the cabinet door are attached to the rack with the wall elements being sealed on to the rack through the use of sealing strips. Such embodiment allows the sealing strips to be fixed to the rack or fixed to the wall elements and the cabinet door thereby resulting in a noticeable savings during the manufacture of the rack.

If, for aesthetic reasons, matching is required, then the outer side of the wall elements and the cabinet door can be covered with a coating such as a powder coating or paint. Such coating can be limited to the outer surfaces of the wall elements and the cabinet door.

If additional parts such as flange plates or the like are attached to the cabinet body, then the design is advantageous in that openings in the wall elements of the cabinet body can be closed by means of aluminum-zinc sheet metal finished flange plates or the like. Such plates can be inserted in the known manner into flange plate openings using sealing strips. In such embodiment, the flange plates or the like are not provided with any surface protection coating on the side that faces the inside of the cabinet body and bears the sealing elements. Also, the flange plate openings have no surface protection coating, at least at the contact surfaces that face inward.

Figure 4:
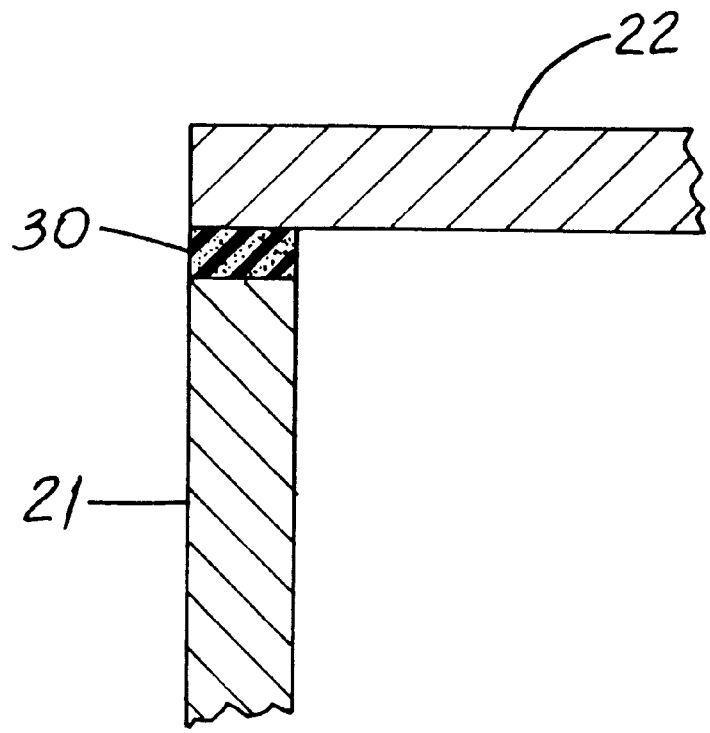
FIG. 4 is a sectional view showing the electrical and magnetic conductive sealing strip positioned in the gap formed by the joining of the walls of the switch cabinet.
Figure 5:
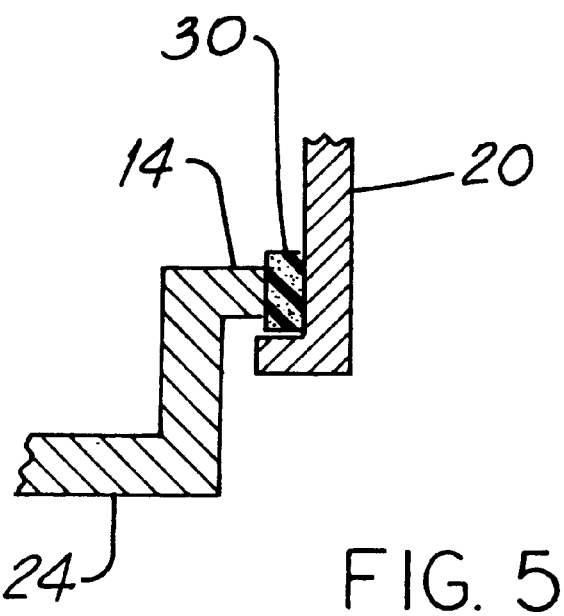
FIG. 5 is a sectional view showing the electrical and magnetic conductive sealing strip positioned between a cabinet rack member and the cabinet door.

On page 6, line 23, insert the following paragraph:

As shown in FIG 4, the electrical and magnetic conductive sealing strips are used to seal the gaps or slots that result when any two of the wall elements such as 21 and 22 are joined together. Such strips are also used to seal the gaps between the cabinet door 20 and wall elements such as 24 or the rack member 14 as shown in FIG 5. The seal that is formed between any two of the wall elements 21–24 and any of the wall elements 21–14 and the cabinet door 20 renders the cabinet HF impervious.

DETAILED DESCRIPTION OF THE PREFERRED EMBODIMENTS

Figure 1:
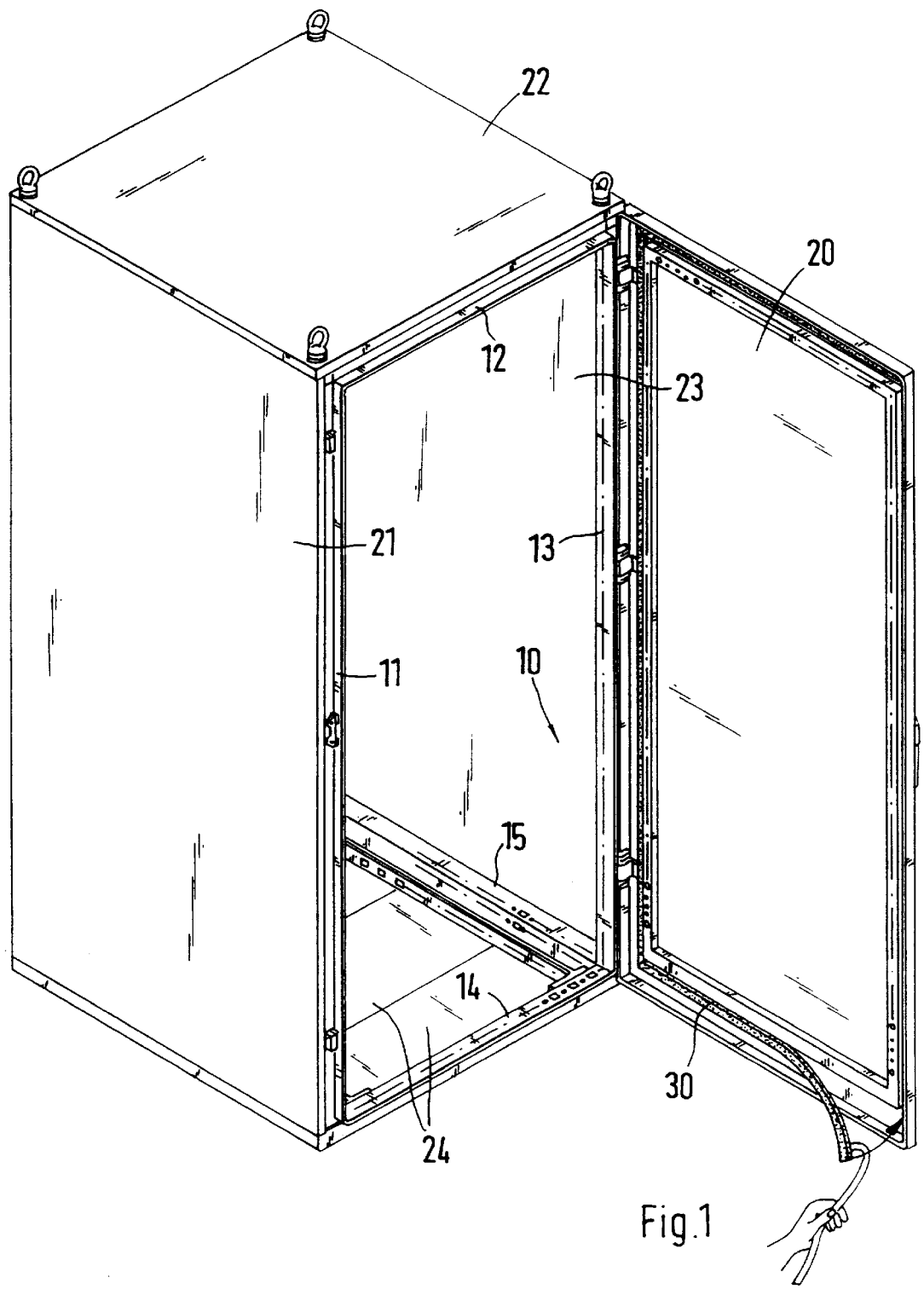
FIG. 1 is a perspective view of a switch cabinet with a rack installed and an open cabinet door.

The switch cabinet according to FIG. 1 features a rack 10, the rack members of which are referenced as 11, 12, 13, 14 and 15 in the perspective drawing. All rack members 11–15 are manufactured of aluminum-zinc coated steel plate. In one embodiment such plates are free of any other coating. The wall elements 21, 22, 23, and 24 as well as cabinet door 20 are also manufactured of aluminum-zinc steel plate, which can easily be processed and have no additional coating at least on the inner side that faces the inside of the cabinet body. The electrical and magnetic conductive sealing strips 30 of the HF seal of the transition gap can be fastened directly to the rack 10 or the wall elements 21–24 and cabinet door 20, as shown in FIGS. 4 and 5. In the preferred embodiment of the invention, the sealing strips 30 are self adhesive. In such embodiment, plastic parts or polymer coated parts are used as connecting elements for the wall elements 21–24 and cabinet door 20, in order to avoid corrosion at these points.

Figure 2:
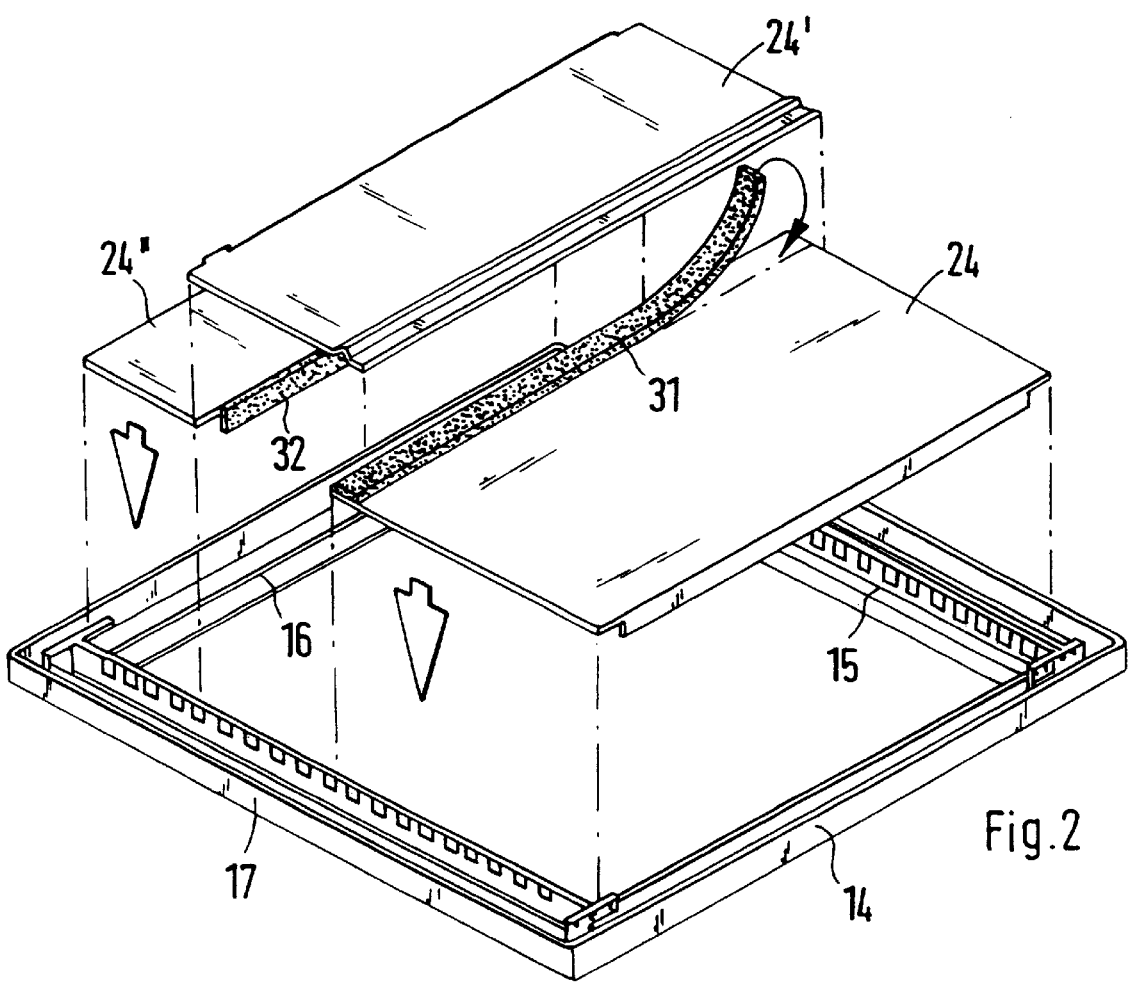
FIG. 2 is a perspective view of one particular embodiment of an HF impervious closure of the floor side of the switch cabinet.

As shown in FIG. 2, the floor side of the rack 10 can also be closed by means of divided flooring sheet metal 24, 24' and 24". The rack members 14, 15, 16 and 17 form a lower rack that forms a circumscribing supporting set off of the floor sheet metal, bearing the sealing strips that face the rack. In this embodiment, the floor sheet metal 24, 24' and 24" comprise aluminum-zinc coated steel sheet metal which is free of any other coating on both sides. The floor sheet metal 24, 24' and 24" can thereby overlap and be provided with additional sealing strips 31 and 32 in the overlapping areas, in order to achieve complete HF imperviousness.

Figure 3:
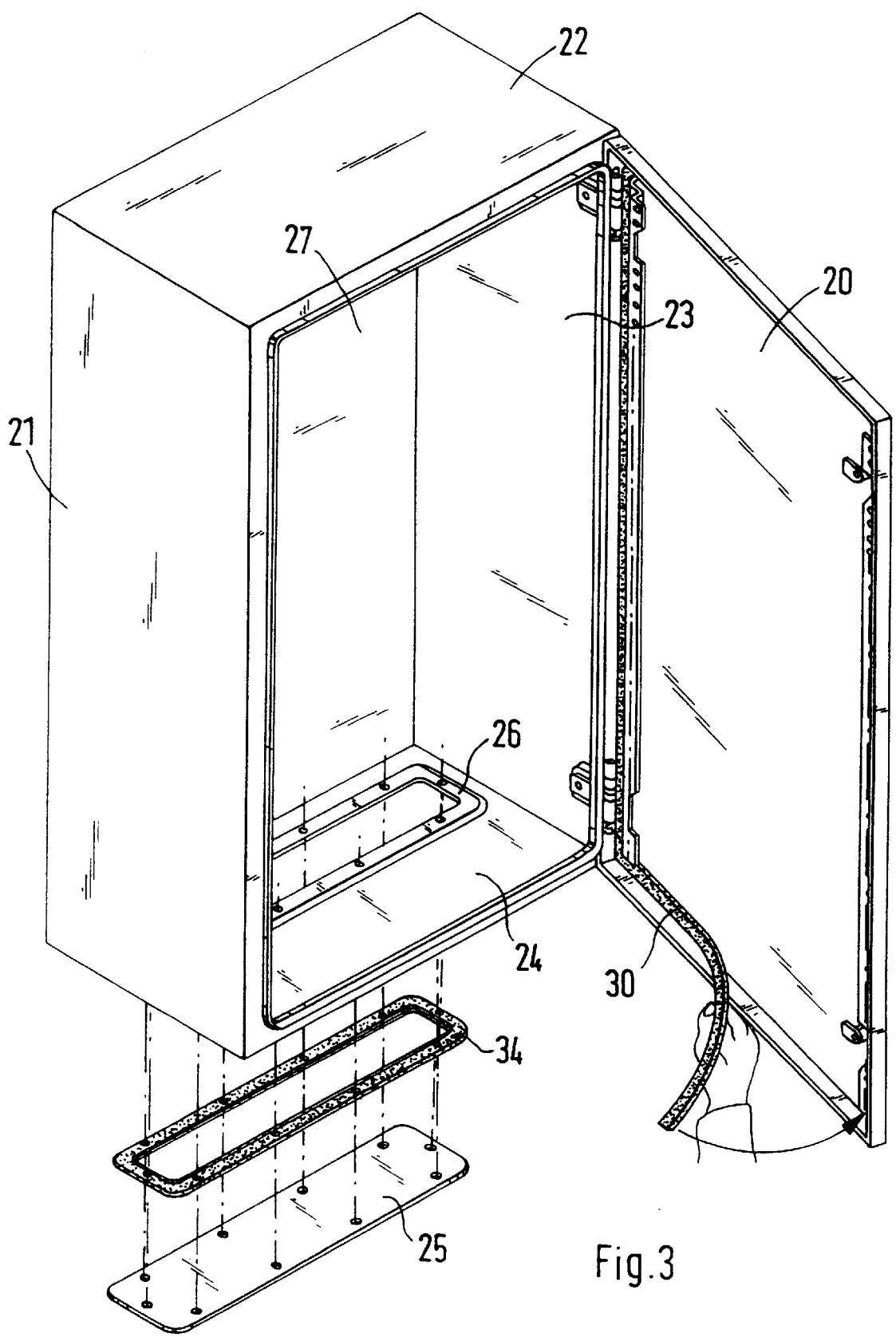
FIG. 3 is a perspective view of a switch cabinet constructed as a wall housing with opened cabinet door.

The switch cabinet illustrated in FIG. 3 is constructed as a wall housing without a rack, whereby the wall elements 21–24 and the rear wall 27 can be constructed from one blank piece and can be welded into a single piece cabinet body at the contact points. Aluminum-zinc coated steel plates that have no additional coating on the inner side of the switch cabinet can be used. The outer side of the cabinet body and the cabinet door 20 may have a surface protective covering applied, which may be formed of powder coating or paint. The wall element 24 that forms the floor of the switch cabinet is provided with a flange plate opening 26 that is surrounded in a known manner by an edge which is set back and is provided with fastening bore holes. The flange plate 25 comprised of aluminum-zinc coated steel sheet metal is used to close the flange plate opening, with the interpositioning of an electrically and magnetically conductive sealing element 34. The flange plate 25 thereby remains free of any coating other than aluminum zinc, at least on the side that faces the flange plate opening 26, and is screwed to the cabinet body. Plastic screws or polymer coated screws may be used for such attachment. As shown in FIG 5, the HF seal between the cabinet door 20 and the cabinet body is preferably provided by directly adhering the sealing strip 30 to the uncoated inner side of the cabinet door 20. Such strip is then applied against the seal support of the cabinet body.

In yet another embodiment, the cabinet body of the wall housing may also be assembled from the wall elements 21–24 as well as a rear wall 27, in such a manner that these parts are welded or soldered to each other at their contact points.

While the principles of the invention have been shown and described in connection with but a few embodiments, it is to be understood clearly that such embodiments are by way of example and not limiting.

What is claimed is:

1. An improved high-frequency (HF) impervious switch cabinet comprised of:

a cabinet body constructed of a plurality of wall elements and having at least one opening capable of being closed by a cabinet door in such a manner that a plurality of gaps exist where the wall elements join together and between the cabinet body and the cabinet door, the wall elements and cabinet door constructed form aluminum-zinc coated sheet metal before fabrication of the switch cabinet; and electrically and magnetically conductive sealing elements that are HF impervious sealing the gaps through connection directly to the cabinet body and cabinet door.

2. The improved switch cabinet of claim 1 wherein the cabinet includes a framework constructed from aluminum-zinc coated sheet metal and the wall elements and cabinet door are mounted on the framework.

3. The HF impervious switch cabinet according to claim 1 wherein:

the wall elements forming a floor of the switch cabinet include a flange plate opening;

a flange plate constructed from aluminum-zinc coated sheet metal having an inner and outer surface is inserted into the flange opening; and the electrically and magnetically conductive sealing element is interposed between the flange plate and edges of the flange opening.

4. The improved switch cabinet of the claim 1 wherein the cabinet body has inner and outer sides and the sealing elements can be connected directly to any portion of the sides to allow for sealing the gaps.

5. The improved switch cabinet according to claim 1 wherein:
   the wall elements and cabinet door have inner and outer sides; and
   the outer sides of the wall elements and the outer side of the cabinet door are provided with paint as an aesthetic surface coating for the aluminum-zinc coated sheet metal.

6. A method of producing an HF impervious switch cabinet comprising the steps of:
   first, constructing wall elements from aluminum-zinc coated sheet metal;
   after the constructing step, forming a cabinet body form the wall elements such that gaps exist where the wall elements join together, the cabinet body being HF impervious upon formation and having at least one opening;
   forming a cabinet door from aluminum-zinc coated sheet metal such that the cabinet door is capable of closing the opening;
   then connection the cabinet door to the cabinet body such that gaps exist between the door and the body; and
   sealing the gaps with electrically and magnetically conductive sealing elements that are HF impervious by connecting the sealing elements directly to the wall elements and the cabinet door.

* * * * *

UNITED STATES PATENT AND TRADEMARK OFFICE
CERTIFICATE OF CORRECTION

PATENT NO.     : 6,384,323 B2
DATED          : May 7, 2002
INVENTOR(S)    : Oskar Elm et al.

It is certified that error appears in the above-identified patent and that said Letters Patent is hereby corrected as shown below:

Column 3,
Lines 16-27, delete "As shown in FIG. 4, the electrical and magnetic conductive sealing strips are used to seal the gaps or slots that result when any two of the wall elements such as 21 and 22 are joined together. Such strips are also to seal the gaps between the cabinet door 20 and wall elements such as 24 or the rack member 14 as shown in FIG. 5. The seal that is formed between any two of the elements 21-14 and the cabinet door 20 renders the cabinet HF impervious."
Line 36, between "embodiment" and "such", insert -- , --.

Column 4,
Before line 30, insert the following paragraph: -- As shown in FIGURE 4, the electrical and magnetic conductive sealing strips are used to seal the gaps or slots that result when any two of the wall elements such as 21 and 22 are joined together. Such strips are also to seal the gaps between the cabinet door 20 and wall elements such as 24 or the rack member 14 as shown in FIGURE 5. As seen in FIGURES 4 and 5, respectively, the seal that is formed between elements 21 and 22 and elements 14 and 20 renders the cabinet HF impervious. --.

Column 5,
Line 13, delete "form" and insert -- from --.

Signed and Sealed this

Twenty-fourth Day of December, 2002

JAMES E. ROGAN
*Director of the United States Patent and Trademark Office*